(12) United States Patent
Loeckenhoff

(10) Patent No.: US 10,164,139 B2
(45) Date of Patent: Dec. 25, 2018

(54) SOLAR CELL UNIT

(71) Applicant: AZUR SPACE Solar Power GmbH, Heilbronn (DE)

(72) Inventor: Ruediger Loeckenhoff, Bietigheim-Bissingen (DE)

(73) Assignee: Azur Space Solar Power GmbH, Heilbronn (DE)

( * ) Notice: Subject to any disclaimer, the term of this patent is extended or adjusted under 35 U.S.C. 154(b) by 36 days.

(21) Appl. No.: 15/468,472

(22) Filed: Mar. 24, 2017

(65) Prior Publication Data
US 2017/0278997 A1 Sep. 28, 2017

(30) Foreign Application Priority Data

Mar. 24, 2016 (DE) .................... 10 2016 003 486

(51) Int. Cl.
H01L 31/054 (2014.01)
H01L 31/0687 (2012.01)
H01L 31/10 (2006.01)
H01L 31/0475 (2014.01)
H02S 30/10 (2014.01)
H01L 31/02 (2006.01)
H01L 31/0224 (2006.01)

(52) U.S. Cl.
CPC .... H01L 31/0543 (2014.12); H01L 31/02008 (2013.01); H01L 31/022433 (2013.01); H01L 31/0475 (2014.12); H01L 31/0687 (2013.01); H02S 30/10 (2014.12); *Y02E 10/544* (2013.01)

(58) Field of Classification Search
CPC .......... H01L 31/0543; H01L 31/0475; H01L 31/02008; H01L 31/022433; H01L 31/0687; H02S 30/10

USPC ........................................................ 136/246
See application file for complete search history.

(56) References Cited

U.S. PATENT DOCUMENTS

| 5,091,018 A | 2/1992 | Fraas et al. |
| 8,680,656 B1 | 3/2014 | Kuo et al. |
| 2009/0120499 A1* | 5/2009 | Prather ............... H01L 31/0547 136/259 |
| 2010/0132793 A1 | 6/2010 | Nakamua et al. |

(Continued)

FOREIGN PATENT DOCUMENTS

| DE | 10 2008 035 735 A1 | 2/2010 |
| DE | 10 2008 055 475 A1 | 6/2010 |

(Continued)

*Primary Examiner* — Jayne L Mershon
(74) *Attorney, Agent, or Firm* — Muncy, Geissler, Olds & Lowe, P.C.

(57) ABSTRACT

A solar cell unit having a semiconductor body formed as a solar cell and having a front side and a back side, a carrier with a top side enclosed by at least four edges, a bottom side, and a first contact surface, formed on the top side and connected to the first terminal contact, and a second contact surface, connected to the second terminal contact and spaced apart from the first contact surface, and a secondary optical element. A back side of the semiconductor body is non-positively connected to a part of the top side of the carrier. The secondary optical element guides light to the front side of the semiconductor body and at least parts of the bottom side of the secondary optical element are non-positively connected to the front side of the semiconductor body and/or to the top side of the carrier by a polymer adhesive layer.

18 Claims, 2 Drawing Sheets

(56) References Cited

U.S. PATENT DOCUMENTS

| | | |
|---|---|---|
| 2010/0224250 A1 | 9/2010 | Hong et al. |
| 2011/0011452 A1 | 1/2011 | Lin et al. |
| 2011/0265852 A1 | 11/2011 | Loeckenhoff et al. |
| 2015/0144189 A1* | 5/2015 | Khorenko ......... H01L 31/02008 136/256 |

FOREIGN PATENT DOCUMENTS

| | | |
|---|---|---|
| DE | 10 2014 223 298 A1 | 5/2016 |
| EP | 2 073 279 A1 | 6/2009 |
| WO | WO 2014/019652 A1 | 2/2014 |

* cited by examiner

SOLAR CELL UNIT

This nonprovisional application claims priority under 35 U.S.C. § 119(a) to German Patent Application No. 10 2016 003 486.6, which was filed in Germany on Mar. 24, 2016, and which is herein incorporated by reference.

BACKGROUND OF THE INVENTION

Field of the Invention

The present invention relates to a solar cell unit.

Description of the Background Art

Solar cell receivers are known, for example, from WO 2014/019652 A1, which corresponds to US 2015/0144189, which is incorporated herein by reference or from EP 2 073 279 A1, which corresponds to US 2010/0132793, and typically have a semiconductor body arranged on a carrier. A primary and a secondary optical element are arranged above the semiconductor body to conduct sunlight to the surface of the semiconductor body. The semiconductor body has a first and a second terminal contact for electrical contacting, each terminal contact being electrically connected to a contact surface, e.g., a trace region, arranged on the carrier.

However, in the conventional art, a major cost component of the previously described solar cell receiver is the size of the carrier.

SUMMARY OF THE INVENTION

It is therefore an object of the invention to provide a device that refines the prior art and enables a production as cost-effective as possible.

According to an exemplary embodiment of the invention, a solar cell unit is provided that has a semiconductor body, formed as a solar cell, a carrier, and a secondary optical element.

The semiconductor body has a front side with a first terminal contact with a first polarity and a back side with a second terminal contact with a second polarity. The semiconductor is formed quadrangular on the top side. Preferably, the first terminal contacts are formed on two opposite sides in each case at the edge. Preferably, the second terminal contact substantially covers the entire back side of the semiconductor body. An advantage of the full-surface back-side contacting is that there is good thermal coupling with the carrier to prevent overheating of the solar cell in particular at temperatures above 100° C.

The carrier can have a top side enclosed by four edges, a bottom side, and first and second contact surfaces formed on the top side. The contact surfaces can be arranged along the first edge of the carrier, whereby the first contact surface is spaced apart from the second contact surface and is connected in an electrically conductive manner to the first electrical terminal contact of the semiconductor body and the second contact surface is connected in an electrically conductive manner to the second electrical terminal contact of the semiconductor body. The back side of the semiconductor body is non-positively connected to a part of the top side of the carrier.

The secondary optical element has a bottom side, whereby the secondary optical element guides light to the front side of the semiconductor body and whereby at least parts of the bottom side of the secondary optical element are non-positively connected to the front side of the semiconductor body and/or to the top side of the carrier solely by a polymer adhesive layer.

It should be noted that the contact surfaces are arranged solely along the first side. In particular, metal tabs are arranged on the contact surfaces. The metal tabs can be angled.

It should be noted, furthermore, that the solar cell can be a III-V semiconductor solar cell with a GaAs or Ge base and the solar cell is formed, for example, as a multi-junction solar cell arranged in a stack and, inter alia, by utilizing UV light components has an efficiency above 30%.

Solar cell units of this type can be used in so-called CPV (Concentrating Photovoltaic) systems, inter alia, because of higher manufacturing costs, compared with silicon solar cells. In the CPV systems, the sunlight is bundled by factors above 100 to above 1000. In this case, the light bundled by means of a primary optical concentrator or element is conducted to the secondary optical element of the solar cell unit.

The primary element, for example, a Fresnel lens, is arranged above the secondary optical element. The light is conducted from the secondary optical element along the optical axis to the polymer adhesive layer, so as to penetrate the polymer adhesive layer and to fall on the front side of the semiconductor body, the solar cell.

An electrical contact with the solar cell unit with another solar cell unit is produced via the particular contact surfaces. The contact surfaces of a plurality of solar cell units are hereby electrically connected, for example, by resistance spot welding to a metallic connecting element. For example, the metallic connecting element can be formed in the shape of a wire or as a wire. In an embodiment, a contact tab can be electrically connected to the contact surface. So as to connect a plurality of solar cell units, the contact tabs of the solar cell units can be connected by metallic connecting elements.

An advantage of the device of the invention is that the size of the carrier can be considerably reduced by the one-sided arrangement of the contacts in comparison with an arrangement on opposite edges of the carrier. It has emerged in a very surprising manner that the novel very small carrier surfaces are also sufficient to remove the heat generated during intensive solar irradiation. It also emerged totally surprisingly that the one-sided arrangement of connecting contacts in close proximity to the solar cell or to the bottom side of the optical element even promotes the removal of the tremendous heat, in particular, if the contact surfaces are made especially large or with contact tabs. In particular, in the pre-wired state, i.e., in the formation of an array, the heat removal by the electrical connecting wires can be increased further hereby. It emerged overall that the size of the solar cell and of the optical element can be decisive for the size of the carrier. There is a further advantage of the saving of space by at least 15% to at least 30% compared with conventional carriers that are at least 3.0 mm by 3.5 mm in size. The saving of material for the carrier results in a substantial resource-saving and cost-effective manufacturing option.

The one-sided arrangement of the contact surfaces contrary to initial assumptions does not make the wiring more difficult. In fact, according to a two-dimensional view, there is apparently the risk of short circuits for a typical meander-shaped arrangement of a plurality of solar cell units and for wiring in series. According to a three-dimensional view, however, this can be avoided, for example, by the use of conductive bridges.

In an embodiment, the first contact surface and the second contact surface are arranged spaced apart from the bottom side of the secondary optical element, as a result of which both contact surfaces are arranged on the top side of the carrier between the bottom side, facing away from the carrier, of the secondary optical element and the first edge of the top side of the carrier.

According to an embodiment, a distance of the bottom side of the secondary optical element from the first edge of the top side of the carrier in a projection, extending perpendicular to the top side of the carrier, is at least 1 mm, preferably at least 3 mm, whereby a distance of the bottom side of the secondary optical element from the second edge, from the third edge, and from the fourth edge in the projection, extending perpendicular to the top side of the carrier, is at most 4 mm, preferably at most 2 mm, most preferably at most 1 mm, or is in a range between 0 mm and 0.2 mm. In an embodiment, in the projection the bottom side of the optical element at at least one or at all of the first to third edges on the top side of the carrier projects out by at most 2 mm. The distance from the edge is taken to mean in each case the shortest route between the virtual border of the optical element, the border produced by the projection on the top side of the carrier, and the edge directly adjacent to the border.

The size of the carrier is reduced by the asymmetrical arrangement of the secondary optical element on the top side of the carrier or the only one-sided providing of the carrier surface for the contact surfaces to be arranged. Whereas the first edge of the carrier is spaced so far apart from the secondary optical element that the two contact surfaces can be arranged along the first edge, the second, third, and fourth edge need to have only a minimum distance from the second optical element.

In an embodiment, in a projection extending perpendicular to the top side of the carrier, the projection area of the optical element is at least 30% or at least 40% or at least 45% or at least 50% of the projection area of the carrier.

In an embodiment, the base area of the secondary optical element in the projection extends over two or three edges of the carrier. An advantage is that the area of the carrier can be made smaller in this way and the costs decline.

In an embodiment, in a projection extending perpendicular to the top side of the carrier, the projection area of the semiconductor body is at least 6% or at least 8% or at least 10% or at least 12% of the projection area of the carrier.

In an embodiment, the first and/or second contact surface adjoin along at least 75% or at least 90% of the length of the first edge.

In an embodiment, the solar cell unit has a substantially rectangular base area of a maximum 20 mm×26 mm or preferably of a maximum 16 mm×22 mm edge length.

In an embodiment, the secondary optical element is made lens-shaped with a convex surface, facing away from the semiconductor body, or funnel-shaped. In an embodiment, the secondary optical element comprises or is formed of glass or in particular a quartz glass compound and is made as a single piece. In an embodiment, the polymer adhesive layer comprises a plastic compound.

In an embodiment, the carrier is formed as a ceramic printed circuit board or as a printed circuit board with an insulated metal substrate and/or the first contact surfaces and the second contact surface are formed as traces. In an embodiment, the semiconductor body has at least two photovoltaically active semiconductor junctions arranged one above the other.

According to an embodiment, a solar cell module has at least one first, second, and third solar cell unit of the above-described type and at least one first and second metallic connecting element, whereby the first, second, and third solar cell units are each arranged with the bottom side on a surface of a base plate, the first metallic connecting element electrically connects the first contact surface of the first solar cell unit to the second contact surface of the second solar cell unit, the second metallic connecting element electrically connects the second contact surface of the first solar cell unit to the first contact surface of the third solar cell unit, and the first metallic connecting element in a first projection, perpendicular to top side of the carrier, covers completely or partially the second contact surface of the first solar cell unit.

It should be noted that the metallic connecting elements, e.g., wires, can be connected in an electrically conductive manner to the contact surfaces by means of resistance spot welding connection. The contact surfaces can be formed entirely flat or alternatively as an angled contact tab.

It is possible by crossing the metallic connecting elements in the area of the second contact surface of the first solar cell unit to arrange and connect in series a plurality of solar cell units with contact surfaces, arranged only on one side, in a simple manner in a typical meander-shaped chain.

In an embodiment, the first metallic connecting element, in a direction extending perpendicular to the surface of the base plate, is spaced apart from the second contact surface of the first solar cell unit and in the area of the second contact surface of the first solar cell unit from the second metallic connecting element, as a result of which short circuits are prevented. A distance can be achieved, for example, by a bridge-shaped or arch-shaped formation of the first metallic connecting element. In an alternative embodiment, the base plate comprises a metal. It is understood that it is advantageous because of the particular mechanical stability to use a wire or a wire-like electrical conductor as a metallic connecting element for a bridge-shape or arch-shaped design.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
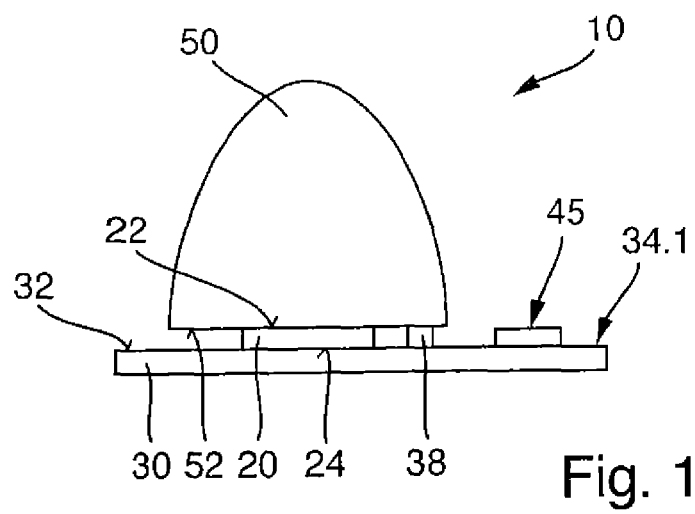
FIG. 1 shows a schematic view of an embodiment of the invention of a solar cell unit.

The illustration in FIG. 1 shows a side view of an exemplary embodiment of a solar cell unit 10, having a semiconductor body 20, a carrier 30, and a secondary optical element 50. The illustration of FIG. 2 shows a schematic top view of solar cell unit 10 illustrated in FIG. 1.

Semiconductor body 20 is non-positively connected with a back side 24 to a top side 32 of carrier 30. A front side 22 is completely covered by secondary optical element 50, whereby secondary optical element 50 is made as a convex lens and a planar bottom side 52 of secondary optical element 50 is non-positively connected by a polymer adhesive layer (not shown) at least partially to front side 22 of semiconductor body 20. Bottom side 52 of secondary optical element 50 in the illustrated exemplary embodiment furthermore covers a protection diode 38 disposed on top side 32 of carrier 30.

Figure 2:
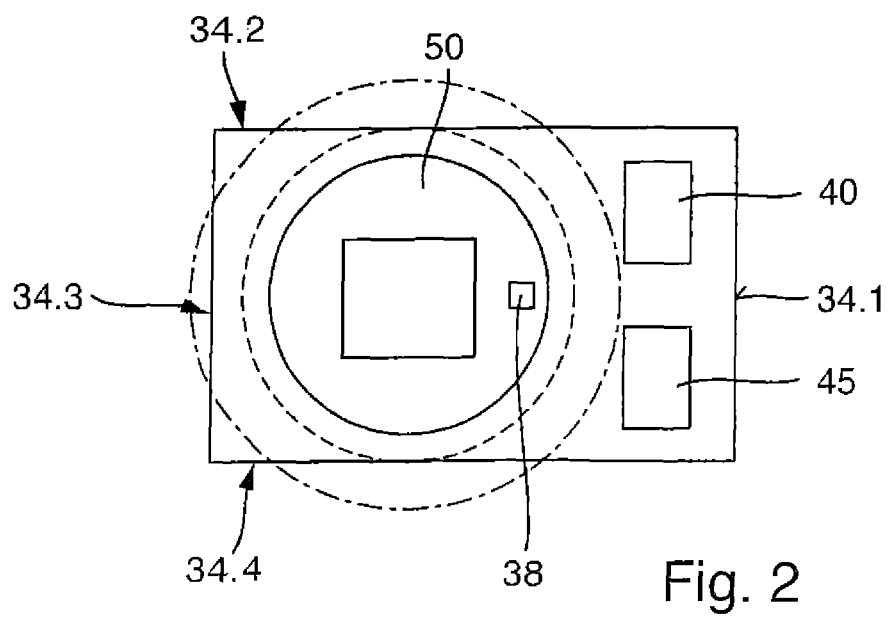
FIG. 2 shows a schematic top view of an embodiment of the invention of a solar cell unit.

As can be seen in FIG. 2, carrier 30 has a rectangular top side 32, enclosed by four edges 34.1, 34.2, 34.3, 34.4. In the illustrated exemplary embodiment, a first and second contact surface 40, 45 are arranged next to secondary optical element 50 and along first edge 34.1 of carrier 30 on top side 32 of carrier 30. In an alternative embodiment (shown by the dashed line), the distance of the bottom side of secondary optical element 50 is in a range between 0 mm and 25 mm away from edges 34.2, 34.3, and 34.4, i.e., virtually flush. In a further embodiment (shown by the dot-dash line), the bottom side of the secondary optical element 50 overruns edges 34.2, 34.3, and 34.4; i.e., the base area of secondary optical element 50 is larger in diameter. An advantage is that the area of the carrier can be made smaller in this way and the costs decline. It is preferred that the secondary optical element is arranged eccentrically relative to the center of gravity of the carrier.

Figure 3:
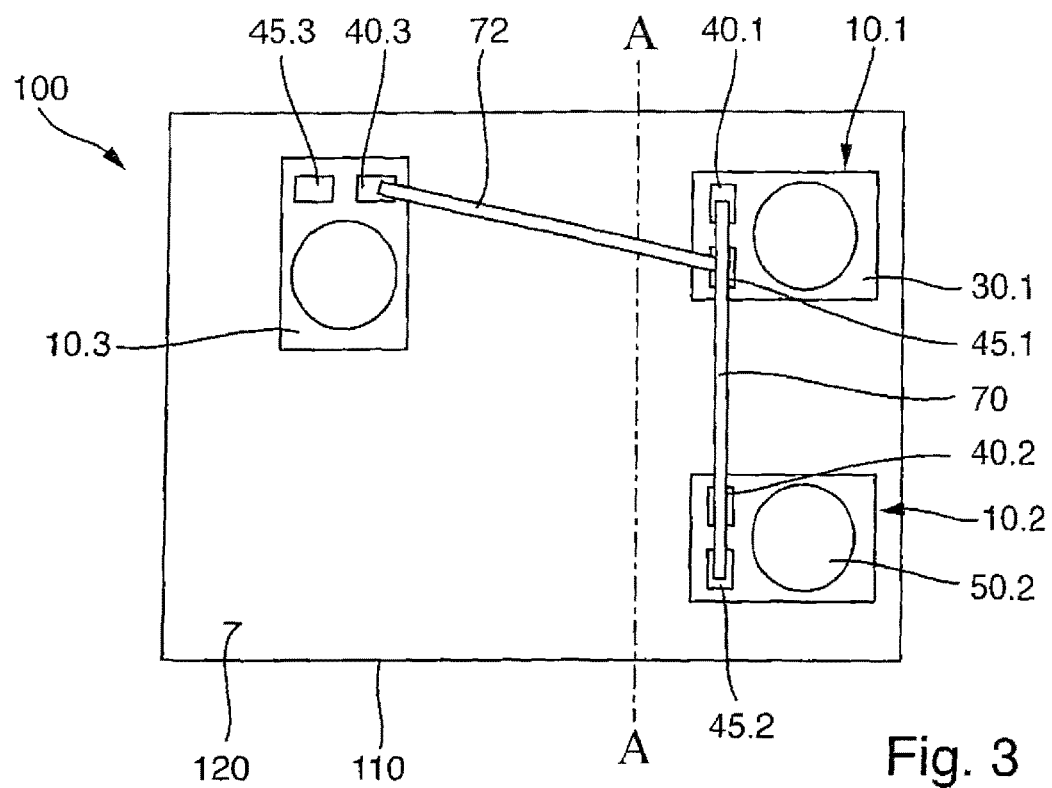
FIG. 3 shows a schematic top view of an embodiment of the invention of a solar cell module.
Figure 4:
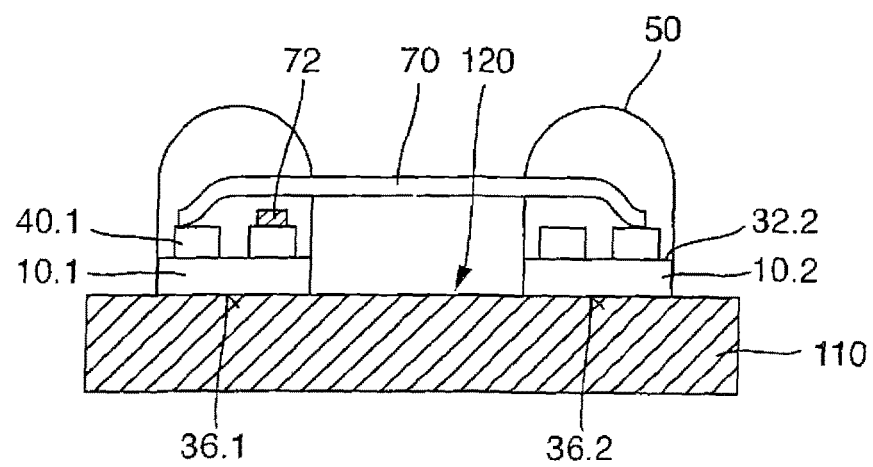
FIG. 4 shows a schematic view of an embodiment of the invention of a solar cell module along section line A-A.

An exemplary embodiment of solar cell module 100 is shown schematically in the illustration of FIG. 3. FIG. 4 shows a section along the line A-A in FIG. 3.

The solar cell module has three solar cell units 10.1, 10.2, 10.3 of the above-described type, whereby solar cell units 10.0, 10.1, 10.2, 10.3 are each arranged with a bottom side 36.1, 36.2 on a surface 120 of a base plate 110.

A first contact surface 40.1 of first solar cell unit 10.1 is connected by a first metallic connecting element 70 to a second contact surface 45.2 of second solar cell unit 10.2, whereby first solar cell unit 10.1 and second solar cell unit 10.2 are arranged next to one another, so that in a projection extending perpendicular to surface 120 of base plate 110, both second contact surface 45.1 of first solar cell unit 10.1 and first contact surface 40.2 of second solar cell unit 10.2 are covered at least partially by first metallic connecting element 70.

To avoid short circuits, as can be seen in the section shown in FIG. 4, first metallic connecting element 70 in a direction extending perpendicular to surface 120 of base plate 110 has a distance from first contact surface 40.2 of second solar cell unit 10.2 and from second contact surface 45.1 of first solar cell unit 10.1.

Further, second contact surface 45.1 of first solar cell unit 10.1 is connected in an electrically conductive manner to a first contact surface 40.3 of third solar cell unit 10.3 by means of a second metallic connecting element 72. The distance of first metallic connecting element 70 from second contact surface 45.1 of first solar cell unit 10.1 is selected to be so large that second metallic connecting element 72 in the area of second contact surface 45.1 of first solar cell unit 10.1 in the direction extending perpendicular to surface 120 of base plate 110 also has a distance from first metallic connecting element 70.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A solar cell unit comprising:
   a semiconductor body, formed as a solar cell and having a front side with a first terminal contact with a first polarity and a back side with a second terminal contact with a second polarity;
   a carrier with a top side, enclosed by at least four edges, a bottom side, a first contact surface, formed on the top side, and a second contact surface, formed on the top side and spaced apart from the first contact surface, the first contact surface is connected in an electrically conductive manner to the first electrical terminal contact of the semiconductor body, the second contact surface is connected in an electrically conductive manner to the second electrical terminal contact of the semiconductor body, and the back side of the semiconductor body is non-positively connected to a part of the top side of the carrier; and
   a secondary optical element with a bottom side, the secondary optical element adapted to guide light to the front side of the semiconductor body and at least parts of the bottom side of the secondary optical element being non-positively connected to the front side of the semiconductor body and/or to the top side of the carrier solely by a polymer adhesive layer,
   wherein the first contact surface and the second contact surface are arranged along a first edge of the carrier, and
   wherein the first and/or second contact surface adjoin along at least 75% of the length of the first edge.

2. The solar cell unit according to claim 1, wherein the first contact surface and the second contact surface are arranged spaced apart from the bottom side of the secondary optical element.

3. The solar cell unit according to claim 1, wherein a distance of the bottom side of the secondary optical element from the first edge of the top side of the carrier, in a projection extending substantially perpendicular to the top side of the carrier, is at least 3 mm, wherein a distance of the bottom side of the secondary optical element from the second edge, from the third edge, and from the fourth edge in the projection, extending substantially perpendicular to the top side of the carrier, is at most 2 mm or at most 1 mm or is in a range between 0 mm and 0.2 mm.

4. The solar cell unit according to claim 1, wherein, in a projection extending substantially perpendicular to the top side of the carrier, the projection area of the optical element is at least 30% or at least 40% or at least 45% or at least 50% of the projection area of the carrier.

5. The solar cell unit according to claim 1, wherein, in a projection, extending substantially perpendicular to the top side of the carrier, the projection area of the semiconductor body is at least 6% or at least 8% or at least 10% or at least 12% of the projection area of the carrier.

6. The solar cell unit according to claim 1, wherein the secondary optical element is lens-shaped with a convex surface facing away from the semiconductor body or wherein the secondary optical element is funnel-shaped.

7. The solar cell unit according to claim 1, wherein the secondary optical element comprises a quartz glass compound and is made as a single piece.

8. The solar cell unit according to claim 1, wherein the polymer adhesive layer comprises a plastic compound.

9. The solar cell unit according to claim 1, wherein the carrier is formed as a ceramic printed circuit board or a printed circuit board with an insulated metal substrate.

10. The solar cell unit according to claim 1, wherein the first contact surfaces and the second contact surface are formed as traces.

11. The solar cell unit according to claim 1, wherein the semiconductor body has at least two photovoltaically active semiconductor junctions arranged one above the other.

12. The solar cell unit according to claim 1, wherein the first and/or second contact surface adjoin along at least 75% or at least 90% of the length of the first edge.

13. The solar cell unit according to claim 1, wherein the solar cell unit comprises a substantially rectangular base area of a maximum of 22 mm×28 mm or a maximum of 16 mm×22 mm edge length.

14. The solar cell unit according to claim 1, wherein the base area of the secondary optical element in the projection projects out over two or three edges of the carrier.

15. The solar cell unit according to claim 1, wherein the first contact surface has a first longitudinal edge and the second contact surface has a second longitudinal edge, the first longitudinal edge and the second longitudinal edge being parallel to the first edge of the carrier, the first longitudinal edge and the second longitudinal edge extending alongside 75% of the first edge of the carrier.

16. A solar cell module comprising:
   at least one first, second, and third solar cell unit according to claim 1; and
   at least one first and one second metallic connecting element,
   wherein the first, second, and third solar cell units are each arranged with the bottom side on a surface of a base plate,
   wherein the first metallic connecting element electrically connects the first contact surface of the first solar cell unit to the second contact surface of the second solar cell unit,
   wherein the second metallic connecting element electrically connects the second contact surface of the first solar cell unit to the first contact surface of the third solar cell unit, and
   wherein the first metallic connecting element in a first projection substantially perpendicular on the top side of the carrier covers completely or partially the second contact surface of the first solar cell unit.

17. The solar cell module according to claim 16, wherein the first metallic connecting element in a direction, extending substantially perpendicular to the surface of the base plate, is spaced apart from the second contact surface of the first solar cell unit and in the area of the second contact surface of the first solar cell unit from the second metallic connecting element.

18. The solar cell module according to claim 16, wherein the base plate comprises a metal or a nonmetal.

* * * * *